(12) United States Patent
Park

(10) Patent No.: US 9,818,892 B2
(45) Date of Patent: Nov. 14, 2017

(54) SOLAR CELL AND METHOD OF FABRICATING THE SAME

(75) Inventor: Duck Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 74 days.

(21) Appl. No.: 14/235,502

(22) PCT Filed: Jul. 26, 2012

(86) PCT No.: PCT/KR2012/005991
§ 371 (c)(1),
(2), (4) Date: Mar. 7, 2014

(87) PCT Pub. No.: WO2013/019028
PCT Pub. Date: Feb. 7, 2013

(65) Prior Publication Data
US 2014/0230891 A1    Aug. 21, 2014

(30) Foreign Application Priority Data
Jul. 29, 2011    (KR) .................. 10-2011-0076276

(51) Int. Cl.
*H01L 31/042* (2014.01)
*H01L 31/0224* (2006.01)
(Continued)

(52) U.S. Cl.
CPC .... *H01L 31/02245* (2013.01); *H01L 31/0465* (2014.12); *H01L 31/0749* (2013.01); *Y02E 10/541* (2013.01)

(58) Field of Classification Search
CPC ........... H01L 31/02245; H01L 31/0465; H01L 31/0749
(Continued)

(56) References Cited

U.S. PATENT DOCUMENTS

| | | |
|---|---|---|
| 2002/0026955 A1 | 3/2002 | Ouchida et al. |
| 2005/0070107 A1 | 3/2005 | Shinohara |

(Continued)

FOREIGN PATENT DOCUMENTS

| | | |
|---|---|---|
| JP | 2007-227577 A | 9/2007 |
| JP | 2007-317885 A | 12/2007 |

(Continued)

OTHER PUBLICATIONS

European Search Report for European Application No. 12819824.9 which corresponds to the above-identified application.
(Continued)

*Primary Examiner* — Jeffrey T Barton
*Assistant Examiner* — Niki Bakhtiari
(74) *Attorney, Agent, or Firm* — LRK Patent Law Firm

(57) ABSTRACT

A solar cell includes a back electrode layer provided on a support substrate and including a first through hole, a light absorbing layer provided on the first through hole and the back electrode layer and including a second through hole, a front electrode layer provided on the second through hole and the light absorbing layer, and a first conductive layer provided on the front electrode layer. Furthermore, the first conductive layer is formed on at least a portion of the front electrode layer which corresponds to the second through hole.

11 Claims, 2 Drawing Sheets

(51) Int. Cl.
*H01L 31/0749* (2012.01)
*H01L 31/0465* (2014.01)

(58) Field of Classification Search
USPC .................................. 136/243–265
See application file for complete search history.

(56) References Cited

U.S. PATENT DOCUMENTS

| | | | |
|---|---|---|---|
| 2007/0193619 A1* | 8/2007 | Shinohara | 136/244 |
| 2008/0314444 A1* | 12/2008 | Kawaguchi | 136/256 |
| 2010/0043860 A1* | 2/2010 | Morita et al. | 136/244 |
| 2010/0258167 A1* | 10/2010 | Chang | H01L 31/022425 136/254 |
| 2011/0284051 A1* | 11/2011 | Miyauchi | 136/244 |
| 2012/0085386 A1* | 4/2012 | Lee | H01L 31/022425 136/244 |

FOREIGN PATENT DOCUMENTS

| | | |
|---|---|---|
| KR | 10-0999810 B1 | 12/2010 |
| KR | 10-2011-0001792 A | 1/2011 |
| WO | 2011-002232 | 1/2011 |

OTHER PUBLICATIONS

International Search Report for International Application No. PCT/KR2012/005991.

KIPO Notice of Allowance for Korean Application No. 10-2011-0076276 which corresponds to the above-identified U.S. Application.

SIPO Office Action for Chinese Application No. 201280047381.8 which corresponds to the above-referenced U.S. application.

* cited by examiner

[Fig. 1]
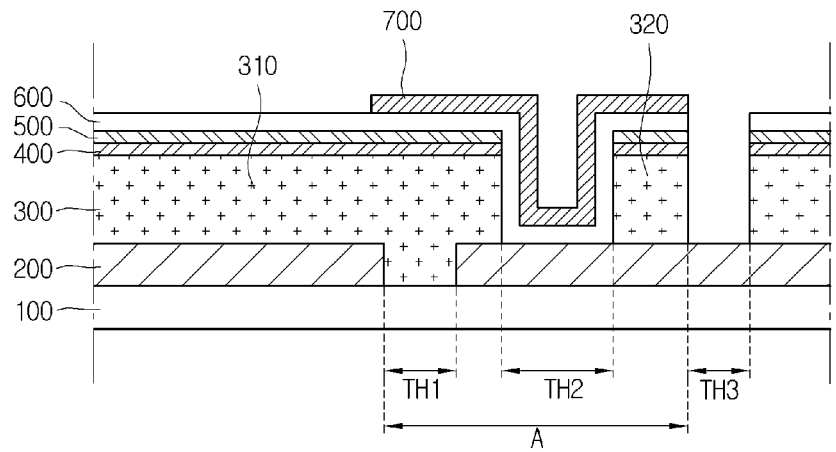
[Fig. 2]
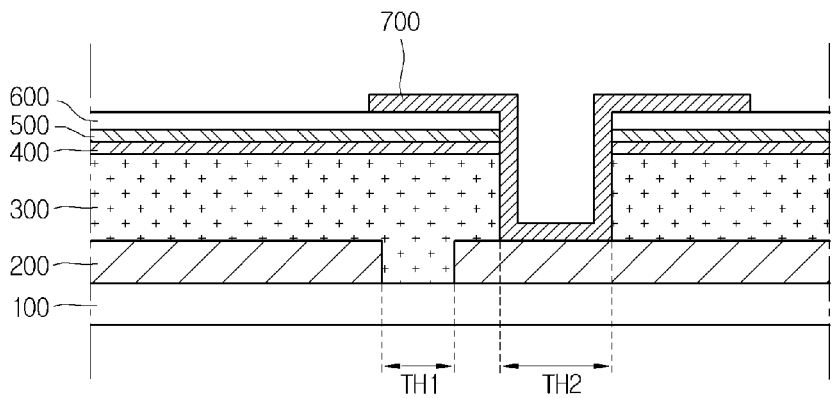
[Fig. 3]
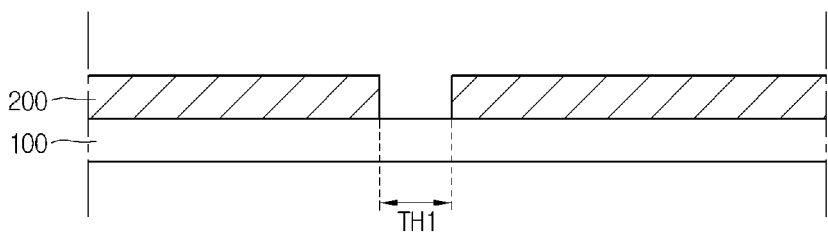
[Fig. 4]
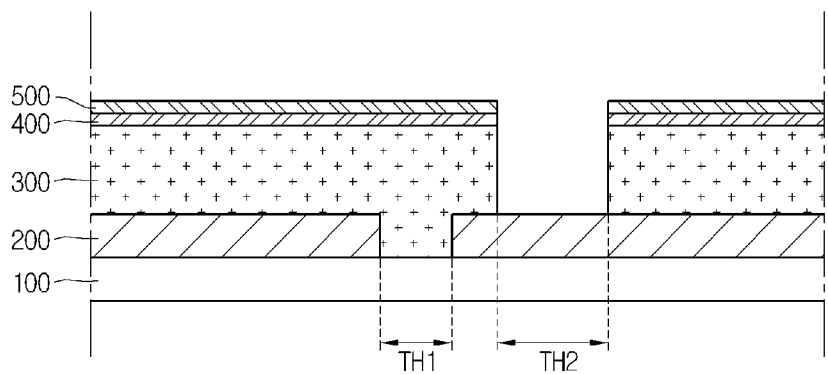

[Fig. 5]
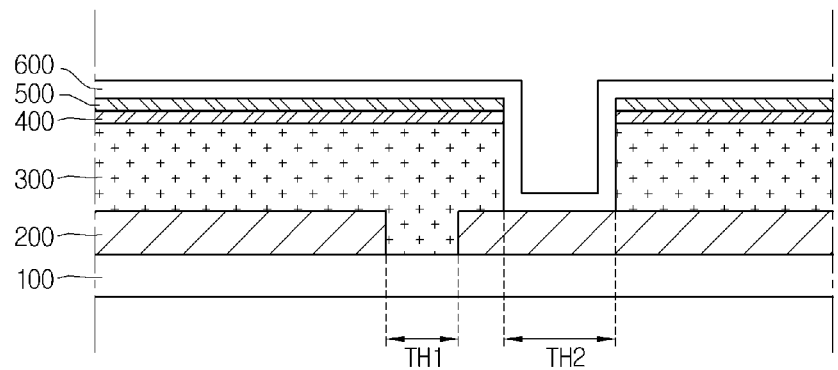
[Fig. 6]
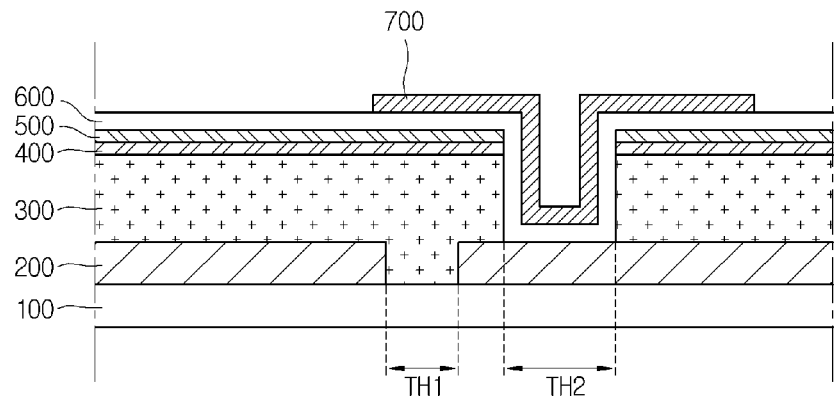
[Fig. 7]
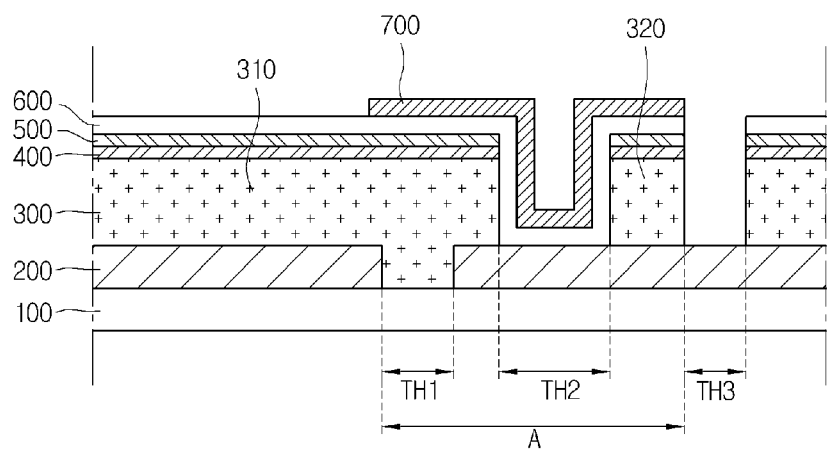

SOLAR CELL AND METHOD OF FABRICATING THE SAME

TECHNICAL FIELD

The embodiment relates to a solar cell and a method of fabricating the same.

BACKGROUND ART

Recently, as energy consumption is increased, a solar cell has been developed to convert solar energy into electrical energy.

In particular, a CIGS-based solar cell, which is a PN hetero junction apparatus having a substrate structure including a glass substrate, a metallic back electrode layer, a P type CIGS-based light absorbing layer, a high resistance buffer layer, and an N type window layer, has been extensively used.

In addition, the solar cell can represent improved efficiency due to the electrical characteristics such as low resistance and high transmittance.

DISCLOSURE OF INVENTION

Technical Problem

The embodiment provides a solar cell which can be easily manufactured and can represent improved photo-electric conversion efficiency.

Solution to Problem

According to the embodiment, there is provided a solar cell including a back electrode layer provided on a support substrate and including a first through hole, a light absorbing layer provided on the first through hole and the back electrode layer and including a second through hole, a front electrode layer on the second through hole and the light absorbing layer, and a first conductive layer provided on the front electrode layer while corresponding to the second through hole.

According to the embodiment, there is provided a method of fabricating a solar cell. The method includes forming a back electrode layer including a first through hole on a support substrate, forming a light absorbing layer on the first through hole and the back electrode layer, forming a second through hole in the light absorbing layer to expose the back electrode layer, forming a front electrode layer on both of the light absorbing layer and the second through hole, and forming a first conductive layer on the front electrode layer.

Advantageous Effects of Invention

As described above, according to the solar cell and the method of fabricating the same, the photo-electric conversion efficiency of the solar cell can be improved by reducing the contact resistance of the solar cell and the connection resistance between a plurality of solar cells.

A typical thin film solar cell module has a structure in which a plurality of solar cells are divided in the unit of a cell, and a plurality of unit cells are connected to each other in series. Accordingly, a dead zone is essentially produced during the patterning process to connect the unit cells to each other in series.

The solar cell according to the embodiment includes a first conductive layer provided on the front electrode layer and corresponding to the second through hole. In other words, the first conductive layer is formed at a region corresponding to the dead zone so that electrons generated by the light are transferred through the first conductive layer, thereby reducing the contact resistance of the solar cell. Accordingly, the solar cell according to the embodiment can represent improved photo-electric conversion efficiency.

BRIEF DESCRIPTION OF DRAWINGS

FIGS. 1 and 2 are sectional views showing a solar cell according to the embodiment; and FIGS. 3 to 7 are sectional views showing the manufacturing procedure of the solar cell according to the embodiment.

MODE FOR THE INVENTION

In the description of the embodiments, it will be understood that, when a substrate, a film, a layer, or an electrode is referred to as being "on" or "under" another substrate, layer, film, or electrode, it can be "directly" or "indirectly" on the other substrate, film, layer, or electrode, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

FIG. 1 is a sectional view showing the sectional surface of a solar cell according to the embodiment. Referring to FIG. 1, the solar cell according to the embodiment is provided on a support substrate 100, and includes a back electrode layer 200 including a first through hole TH1, a light absorbing layer 300 provided on the first through hole TH1 and the back electrode layer 200, and including a second through hole TH2, a buffer layer 400 and a high resistance buffer layer 500 provided on the light absorbing layer 300, a front electrode layer 600 provided on the second through hole TH2 and the light absorbing layer 300, and a first conductive layer 700 provided on the front electrode layer 600 and corresponding to the second through hole TH2.

The support substrate 100 has a plate shape and supports the back electrode layer 200, the light absorbing layer 300, the buffer layer 400, the high resistance buffer layer 500, the front electrode layer 600, and the first conductive layer 700.

The support substrate 100 may include an insulator. The support substrate 100 may include a glass substrate, a plastic substrate, or a metallic substrate. In more detail, the support substrate 100 may include a soda lime glass substrate. The support substrate 100 may be transparent or may be rigid or flexible.

The back electrode layer 200 is provided on the substrate 100. The back electrode layer 200 may be a conductive layer. The back electrode layer 200 may include a metal, such as molybdenum (Mo).

In addition, the back electrode layer 200 may include at least two layers. In this case, the layers may be formed by using the homogeneous metal or heterogeneous metals.

The back electrode layer 200 is provided therein with first through holes TH1. The first through holes TH1 are open regions to expose the top surface of the support substrate 100. When viewed in a plan view, first through holes TH1 may have a shape extending in one direction.

The first through holes TH1 may have a width in the range of about 80 μm to about 200 μm.

The back electrode layer 200 is divided into a plurality of back electrodes by the first through holes TH1. In other words, the back electrodes are defined by the first through holes TH1.

The back electrodes are spaced apart from each other by the first through holes TH1. The back electrodes are arranged in the form of a stripe. In addition, the back electrodes may be arranged in the form of a matrix. In this case, when viewed in a plan view, the first through holes TH1 may be provided in the form of a lattice.

The light absorbing layer 300 is provided on the back electrode layer 200. In addition, a material constituting the light absorbing layer 300 is filled in the first through holes TH1.

The light absorbing layer 300 includes a group I-III-VI compound. For example, the light absorbing layer 300 may have a Cu(In,Ga)Se2 (CIGS) crystal structure, a Cu(In)Se2 crystal structure, or a Cu(Ga)Se2 crystal structure.

The light absorbing layer 300 has an energy bandgap in the range of about 1 eV to about 1.8 eV.

The buffer layer 400 is provided on the light absorbing layer 300. The buffer layer 400 includes CdS and has an energy bandgap in the range of about 2.2 eV to about 2.4 eV.

The high resistance buffer layer 500 is provided on the buffer layer 400. The high-resistance buffer layer 500 may include iZnO, which is zinc oxide not doped with impurities. The high resistance buffer layer 500 has an energy bandgap in the range of about 3.1 eV to about 3.3 eV.

The light absorbing layer 300, the buffer layer 400, and the high resistance buffer layer 500 are formed therein with second through holes TH2. The second through holes TH2 are formed through the light absorbing layer 300. In addition, the second through holes TH2 are open regions to expose the top surface of the back electrode layer 200.

The second through holes TH2 are adjacent to the first through holes TH1. In other words, when viewed in a plan view, portions of the second through holes TH2 are formed beside the first through holes TH1. The second through holes TH2 have a shape extending in a first direction.

Each second through hole TH2 may have a width in the range of about 80 μm to about 200 μm.

A plurality of light absorbing parts 310, 320, . . . , and N are defined in the light absorbing layer 300 by second through holes TH2. In other words, the light absorbing layer 300 is divided into the light absorbing parts 310, 320, . . . , N by the second through holes TH2.

A plurality of buffers are defined in the buffer layer 400 by the second through holes TH2. In other words, the buffer layer 400 is divided into a plurality of buffers by the second through holes TH2.

A plurality of high resistance buffers are defined in the high resistance buffer layer 500 by the second through holes TH2. In other words, the high resistance buffer layer 500 is divided into the high resistance buffers by the second through holes TH2.

The front electrode layer 600 is provided on the high resistance buffer layer 500. The front electrode layer 600 is transparent, and includes a conductive layer. In addition, the front electrode layer 600 has resistance greater than that of the back electrode layer 200.

The front electrode layer 600 includes an oxide. For example, the front electrode layer 600 may include an Al doped zinc oxide (AZO), or a Ga doped zinc oxide (GZO).

The buffer layer 400, the high resistance buffer layer 500, and the front electrode layer 600 are formed therein with third through holes TH3. The third through holes TH3 are open regions to expose the top surface of the back electrode layer 200. For example, each third through hole TH3 has a width in the range of about 80 μm to about 200 μm.

The third through holes TH3 are adjacent to the second through holes TH2. In more detail, the third through holes TH3 are formed beside the second through holes TH2. In other words, when viewed in a plan view, the third through holes TH3 are formed beside the second through holes TH2.

The front electrode layer 600 is divided into a plurality of windows by the third through holes TH3. In other words, front electrode layers are defined by the third through holes TH3.

The front electrode layer 600 has a thickness in the range of about 0.5 μm to about 1.5 μm. In addition, a plurality of cells C1, C2, . . . , and Cn are defined by the third through holes TH3. In more detail, the solar cell according to the embodiment is divided into the cells C1, C2, . . . , and Cn are defined by the third through holes TH3. In addition, the cells C1, C2, . . . , and Cn are connected to each other in a second direction crossing a first direction. In other words, current may flow in the second direction through the cells C1, C2, . . . , and Cn.

As described above, the back electrode layers are spaced apart from each other by a predetermined distance due to the first through holes TH1. Accordingly, there exists a region that cannot act as the solar cell so that the efficiency of the solar cell is degraded. The region is called a dead zone. Referring to FIG. 1, the dead zone corresponds to a region provided from the first through hole TH1 before the third through hole TH3 (part A).

In order to solve the above problem related to the dead zone, the solar cell according to the embodiment includes the first conductive layer 700 provided on the front electrode layer 600 and corresponding to the second through hole TH2. In other words, the first conductive layer 700 is formed corresponding to the dead zone, and electrons generated by light are moved via the first conductive layer 700, thereby improving characteristics such as electrical conductivity and series resistance and reducing the contact resistance of the solar cell.

The first conductive layer 700 is provided on the front electrode layer 600. For example, the first conductive layer 700 may directly make contact with the front electrode layer 600 while corresponding to the second through hole TH2.

The first conductive layer 700 may be formed at various regions corresponding to the second through hole TH2. For example, the first conductive layer 700 may be formed only at an upper portion of the second through hole TH2. In addition, the first conductive layer 700 may be provided at the entire portion of the front electrode layer 600.

In addition, as shown in FIG. 1, the first conductive layer 700 may be formed from an upper portion of the first through hole TH1 to the upper portion of the second through hole TH2.

The first conductive layer 700 may have a thickness in the range of about 1 μm to about 5 mm, but the embodiment is not limited thereto. In addition, the first conductive layer 700 may have a width in the range of about 300 μm to about 500 μm, but the embodiment is not limited thereto.

In other words, if the first conductive layer 700 includes a region corresponding to the second through hole TH2, the first conductive layer 700 may be formed at various positions with various lengths and thicknesses.

The first conductive layer 700 according to the embodiment includes a material selected from the group consisting of Ag, Ni, Cu, Al Cr, and the combination thereof. For example, the first conductive layer 700 may be formed by forming a paste layer having particles including a material selected from the group consisting of Ag, Ni, Cu, Al Cr, and the combination thereof and by performing heat treatment with respect to the paste layer.

Until now, the first conductive layer 700 has been described in that the first conductive layer 700 has a structure connected with the back electrode layer 200 through the front electrode layer 600 formed on the second through hole TH2.

In addition, according to the solar cell of the embodiment, the first conductive layer 700 may directly make contact with the back electrode layer 200. In other words, referring to FIG. 2, the first conductive layer 700 directly make contact with the back electrode layer 200 through the second through hole TH2. In this case, the second through hole TH2 is formed on the back electrode layer 200 through the light absorbing layer 300, the first buffer layer 400, the high resistance buffer layer 500, and the front electrode layer 600.

FIGS. 3 to 7 are sectional views showing a method of fabricating a solar cell according to the embodiment. Hereinafter, the present method of fabricating the solar cell will be described by making reference to the above description of the solar cell.

Referring to FIG. 3, the back electrode layer 200 is formed on the support substrate 100. The first through holes TH1 are formed by patterning the back electrode layer 200. Accordingly, a plurality of back electrodes are formed on the support substrate 100. The back electrode layer 200 may be patterned by using a laser. The first through holes TH1 may expose the top surface of the support substrate 100 and may have a width of about 80 μm to about 200 μm.

Referring to FIG. 4, the light absorbing layer 300, the buffer layer 400, and the high resistance buffer layer 500 are formed on the back electrode layer 200.

The light absorbing layer 300 may be formed through a sputtering process or an evaporation scheme.

For example, the light absorbing layer 300 may be formed through various schemes such as a scheme of forming a Cu(In,Ga)Se2 (CIGS) based-light absorbing layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the Cu(In,Ga)Se2 (CIGS) based-light absorbing layer 300 is formed.

In addition, the sputtering process employing the Cu target, the In target, and the Ga target and the selenization process may be simultaneously performed.

In addition, a CIS or a CIG light absorbing layer 300 may be formed through a sputtering process employing only Cu and In targets or only Cu and Ga targets and the selenization process.

Thereafter, the buffer layer 400 may be formed after depositing CdS through a sputtering process or a CBD (chemical bath deposition) scheme.

Thereafter, in the state that the mask 20 is mounted, zinc oxide is deposited on the buffer layer 400 through a sputtering process, and the high-resistance buffer layer 500 is formed.

The buffer layer 400 and the high-resistance buffer layer 500 are deposited at a low thickness. For example, the thicknesses of the buffer layer 400 and the high-resistance buffer layer 500 may be in the range of about 1 nm to about 80 nm.

The second through grooves TH2 are formed by removing portions of the light absorbing layer 300, the buffer layer 400, and the high-resistance buffer layer 500.

The second through grooves TH2 may be formed by using a mechanical device such as a tip or a laser device.

For example, the light absorbing layer 300 and the buffer layer 400 may be patterned by using the tip having a width of about 40 μm to about 180 μm. In addition, the second through grooves TH2 may be formed by the laser having a wavelength of about 200 nm to about 600 nm.

In this case, the width of the second through grooves TH2 may be in the range of about 100 μm to about 200 μm. The second through grooves TH2 expose portions of the top surface of the back electrode layer 200.

Referring to FIG. 5, the front electrode layer 600 is formed on the light absorbing layer 300 and inside the second through holes TH2. In other words, the front electrode layer 600 is formed by depositing transparent conductive material on the high resistance buffer layer 500 and inside the second through holes TH2.

Thereafter, the first conductive layer 700 is formed on the front electrode layer 600. A step of forming the first conductive layer 700 includes a step of forming the paste layer including first conductive particles and a step of forming heat treatment form the paste layer.

The paste includes the first conductive particles, an organic binder, and a solvent. If necessary, the paste may further include glass frit. The content of the glass frit is in the range of about 1 weight % to about 20 weight % based on the whole weight of a composition of the paste.

In this case, the first conductive particles may include a material selected from the group consisting of Ag, Ni, Cu, Al Cr, and the combination thereof. In more detail, the first conductive particles may include Ag. For example, the Ag particles having a specific surface area of 0.10 m2/g to 0.80 m2/g may be used.

The binder includes various binders which are sufficient to fabricate the paste and generally known as those skilled in the art. For example, the binder may include acrylic polymer obtained by copolymerizing acryl monomers, such as carboxyl group, having a hydrophile property or a cellulose-based polymer such as ethyl cellulose, hydroxyethyl cellulose, hydroxypropyl cellulose, hydroxyethylhydroxypropyl. The content of the organic binder may be in the range of about 1 weight % to about 20 weight %.

In addition, the solvent includes various solvents which are sufficient to fabricate the paste and generally known as those skilled in the art. For example, the solvent may include methyl cellosolve, ethyl cellosolve, butyl cellosolve, aromatic alcohol, α-terpineol, β-terpineol, dihydro-terpineol, ethylene glycol, ethylene glycol mono butyl ether, butyl cellosolve acetate, and texanol, but the embodiment is not limited thereto.

The fabricated paste layer including the first conductive particles may be coated on the front electrode layer 600 through a screen printing scheme, a dispensing scheme, or an ink-jet scheme. Then, the firing temperature is adjusted to about 100° C. to about 800° C. in the step of performing the heat treatment for the paste layer.

The third through holes TH3 are formed by removing portions of the buffer layer 400, the high resistance buffer layer 500, the front electrode layer 600, and the first conductive layer 700. Accordingly, the first conductive layer 700, the front electrode layer 600, and the light absorbing layer 300 have cutting surfaces aligned in line with each other.

The front electrodes and the cells C1, C2, . . . , and Cn are defined by patterning the front electrode layer 600. The third through holes TH3 may have a width of about 80 μm to about 200 μm.

Until now, the embodiment has been described in that the second through holes TH2 are formed before the front electrode layer 600 is formed on the high resistance buffer layer 500.

In addition, according to the method of fabricating the solar cell of the embodiment, the second through hole TH2 may be formed after the front electrode layer 600 has been formed on the high resistance buffer layer 500. In other words, the light absorbing layer 300, the buffer layer 400, the high resistance buffer layer 500, and the front electrode layer 600 have cutting surfaces aligned in line with each other due to the second through hole TH2.

Thereafter, the first conductive layer 700 is formed inside the second through holes TH2 through a deposition process. In this case, the first conductive layer 700 may be connected to the back electrode layer 200 while directly making contact with the back electrode layer 200. In other words, referring to FIG. 2, the first conductive layer 700 directly makes contact with the back electrode layer 200 through the second through hole TH2.

For example, the second and third through holes TH2 and TH3 may be simultaneously formed. In this case, a patterning process can be simplified, so that the process of fabricating the solar cell not only can be simplified, but the fabricating cost can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a back electrode layer provided on a support substrate and including a first through hole;
a light absorbing layer provided on the first through hole and the back electrode layer and including a second through hole;
a buffer layer provided on the light absorbing layer and including the second through hole;
a high resistance buffer layer provided on the buffer layer and including the second through hole;
a front electrode layer provided on a surface of the second through hole and the high resistance buffer layer along the surface of the second through hole and the high resistance buffer layer;
a third through hole disposed through the front electrode layer, the high resistance buffer layer, the buffer layer and the light absorbing layer;
a dead zone ranging in width from a region corresponding to the first through hole to a region before the third through hole; and
a first conductive layer disposed on the front electrode layer and corresponding to the dead zone,
wherein the light absorbing layer is filled in the first through hole,
wherein the second through hole is adjacent to the first through hole, and the third through hole is adjacent to the second through hole,
wherein the front electrode layer is disposed on a portion of an inner part of the second through hole,
wherein the first conductive layer is disposed on the front electrode layer of the portion of the inner part of the second through hole,
wherein the second through hole has a space,
wherein the first conductive layer makes direct contact with the front electrode layer,
wherein the first conductive layer is spaced from the high resistance buffer layer, the buffer layer, the light absorbing layer and the back electrode layer, and
wherein a width of the first conductive layer is equal to a width of the dead zone.

2. The solar cell of claim 1, wherein the first conductive layer includes a material selected from the group consisting of Ag, Ni, Cu, Al Cr, and a combination thereof.

3. The solar cell of claim 1, wherein the first conductive layer has a thickness in a range of 1 μm to 5 mm.

4. The solar cell of claim 1, wherein the first conductive Layer, the front electrode layer, the high resistance buffer layer, the buffer layer and the light absorbing layer include cutting surfaces aligned in line with each other.

5. A method of fabricating a solar cell, the method comprising:
forming a back electrode layer including a first through hole on a support substrate;
forming a light absorbing layer on the first through hole and the back electrode layer;
forming a buffer layer on the light absorbing layer;
forming a high resistance buffer layer on the buffer layer;
forming a second through hole in the light absorbing layer, the buffer layer and the high resistance buffer layer to expose the back, electrode layer;
forming a front electrode layer on both of the high resistance buffer layer and a surface of the second through hole along the high resistance buffer layer, the buffer layer and the light absorbing layer, and the surface of the second through hole;
forming a third through hole through the front electrode layer, the high resistance buffer layer, the buffer layer and the light absorbing layer, wherein the second through hole is adjacent to the first through hole and the third through hole is adjacent to the second through hole;
forming a dead zone ranging in width from a region corresponding to the first through, hole to a region before the third through hole; and
forming a first conductive layer corresponding to the dead zone, wherein the light absorbing layer is filled in the first through hole, wherein the front electrode layer is disposed on a portion of an inner part of the second through hole, wherein the first conductive layer is disposed on the front electrode layer of the portion of the inner part of the second through hole, wherein the second through hole has a space, wherein the first conductive layer makes direct contact with the front electrode layer, wherein the first conductive layer is spaced from the high resistance buffer layer, the buffer layer, the light absorbing layer and the back electrode layer, and wherein a width of the first conductive layer is equal to a width of the dead zone.

6. The method of claim 5, wherein the forming of the first conductive layer comprises:

forming a paste layer including first conductive particles; and performing heat treatment with respect to the paste layer.

7. The method of claim 6, wherein the paste layer further includes an organic binder and a solvent.

8. The method of claim 7, wherein the first conductive particles include material selected from the group consisting of Ag, Ni, Cu, Al Cr, and a combination thereof.

9. The method of claim 7, wherein the first conductive particles have a specific surface area in a range of $0.10$ $m^2/g$ to $0.80$ $m^2/g$.

10. The solar cell of claim 1, wherein one side surface of the first conductive layer is vertically overlapped with a side surface of the first through hole, and another side surface of the first conductive layer is vertically overlapped with a side surface of the third through hole.

11. The solar cell of claim 1, wherein the first conductive layer comprises a first top surface and a second top surface lower than the first top surface, the second top surface being disposed corresponding to the second through hole.

* * * * *